United States Patent [19]
Locher et al.

[11] Patent Number: 4,563,995

[45] Date of Patent: Jan. 14, 1986

[54] METHOD OF AND CIRCUIT FOR ANALYZING OUTPUT SIGNALS FROM A SENSOR INSTALLED IN AN INTERNAL COMBUSTION ENGINE

[75] Inventors: Johannes Locher, Stuttgart; Wolfgang Schmidt, Vaihingen, both of Fed. Rep. of Germany

[73] Assignee: Robert Bosch GmbH, Stuttgart, Fed. Rep. of Germany

[21] Appl. No.: 549,794

[22] Filed: Nov. 7, 1983

[30] Foreign Application Priority Data

Dec. 4, 1982 [DE] Fed. Rep. of Germany ....... 3244940

[51] Int. Cl.$^4$ ............................................... F02B 3/00
[52] U.S. Cl. .................................... 123/494; 123/488; 123/501
[58] Field of Search ............... 123/488, 494, 425, 501, 123/502, 478; 73/119

[56] References Cited

U.S. PATENT DOCUMENTS

| | | | |
|---|---|---|---|
| 4,346,586 | 8/1982 | Furrey | 123/425 |
| 4,370,963 | 2/1983 | Iwata | 123/425 |
| 4,423,621 | 1/1984 | Kenichi | 123/425 |

FOREIGN PATENT DOCUMENTS 2083246 3/1982 United Kingdom ............... 123/494

*Primary Examiner*—Ronald B. Cox
*Attorney, Agent, or Firm*—Michael J. Striker

[57] ABSTRACT

A method for evaluating output signals of a sensor for measuring operational parameters of an internal combustion engine, utilizes characteristic wave forms of signal portions derived from a sensor. Threshold levels for setting the beginning and the end of an injection process are determined from threshold levels of an (n+m)th signal portion which are derived from a fraction of preceding nth signal. The device for carrying out this method includes a store for the peak value of the nth signal and a controlled discharging device which cooperates with a threshold switch and which is controlled by other parameters of the engine such as rotary speed.

18 Claims, 11 Drawing Figures

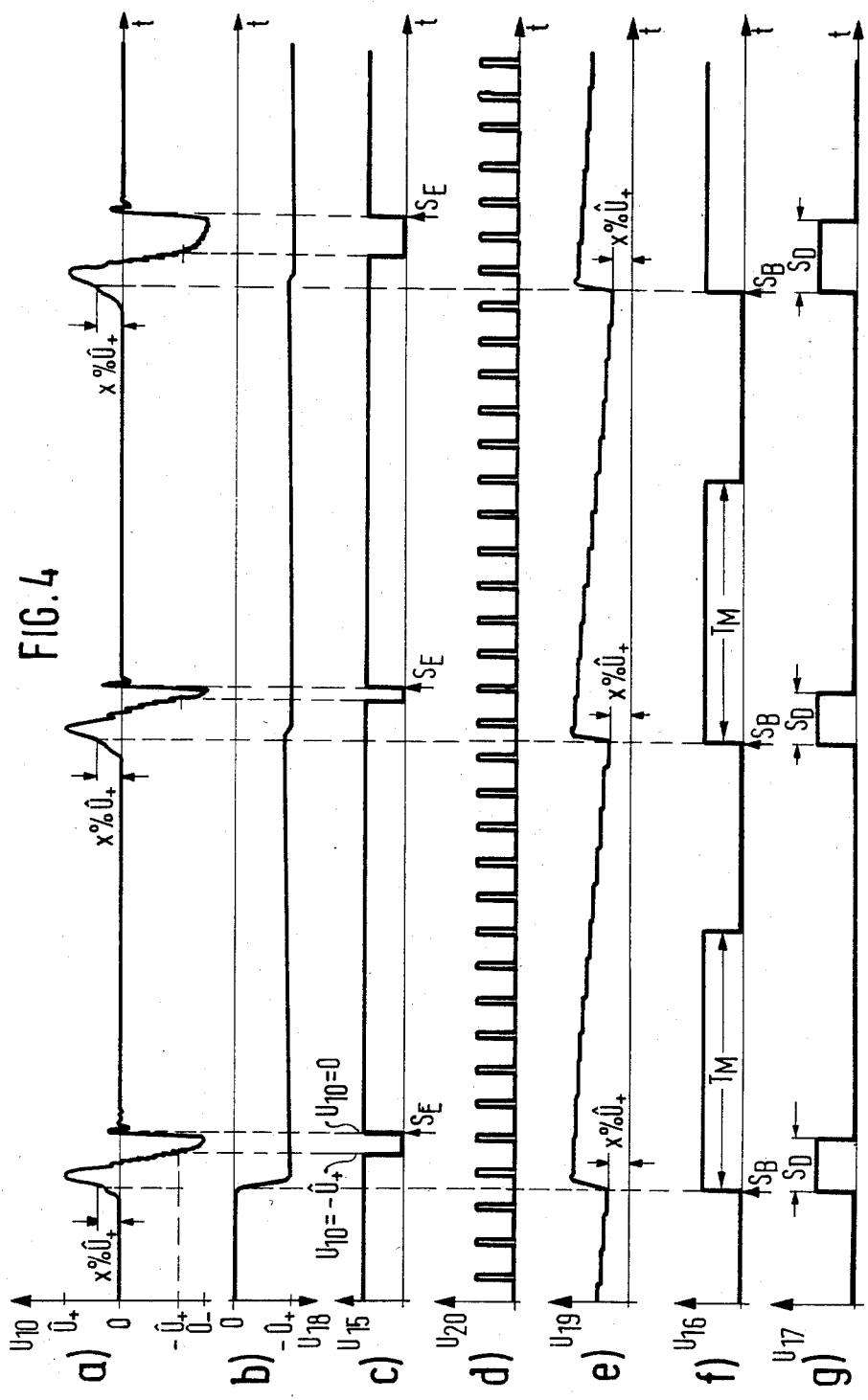

METHOD OF AND CIRCUIT FOR ANALYZING OUTPUT SIGNALS FROM A SENSOR INSTALLED IN AN INTERNAL COMBUSTION ENGINE

BACKGROUND OF THE INVENTION

The invention relates in general to an analyzing of operational conditions of an internal combustion engine, and in particular it relates to a method of and a device for analyzing the series of output signals from a sensor installed in an internal combustion engine for picking up data characteristic of operational conditions of the engine. The sensor is of the type which delivers a succession of electrical signals whose waveform is dependent on the measured value.

An important characteristic value for determining operational state of an engine or for controlling or regulating an optimum operation of the latter is the dosed amount of fuel. Especially in the case of gas engines having a direct injection of fuel there is the possibility to determine the dosed amount of fuel at known pressure in its supply conduit by measuring the time of opening of the fuel injection valves. A particular method for determining the duration of injection is based on the detection by means of a sensor of the stroke or velocity of the nozzle needle in the injection valve.

For example, in the German publication No. 3,032,381 an electronic control device is disclosed in which a signal corresponding to the duration of injection is employed for controlling or regulating various magnitudes such as the start of injection, the amount of injection or the rate of exhaust gas return. In this known device, a nozzle needle sensor is used as a pickup of the measured values, whereby the electrical output signals are generated in response to the movement of the nozzle needle of the injection valve in an inductive element. According to FIG. 4 of the aforementioned German publication, the inductive element is energized from a source of constant current. In analyzing the output signals, the latter are subjected to a single or repeated differentiation to increase the steepness of the flanks of the wave forms and then the signals are fed through threshold switches.

The disadvantage of this prior art arrangement is the fact that due to the dependency of the output voltage of the sensors of the movement of the nozzle needle on the rotary speed of the engine, considerable errors may occur under circumstances in the determination of the beginning and of the end of the fuel injecting process. In addition, high frequency interference signals in pulses of a relatively large amplitude are superposed to the measuring signals of the needle stroke sensor. These interference signals result from changes of movement of the nozzle needle which in practice are truly complicated during the closing and opening of the fuel injection valve. Different output voltages may be caused also due to variations of electrical output data occurring from one sensor to another and consequently the threshold levels of the threshold switches must be adjusted individually.

SUMMARY OF THE INVENTION

A general object of the present invention is to overcome the aforementioned disadvantages.

More particularly, it is an object of the present invention to provide an improved method of and device for analyzing or interpreting output data from the sensors of the aforedescribed kind, in which substantially higher precision and interference resistance in the determination of the duration of a fuel dose is achieved.

An additional object of this invention is to eliminate timing errors at the beginning of the fuel injection process resulting from the dependency on the rotary speed of the engine and due to the manufacturing tolerances of the sensors.

In keeping with these objects and others which will become apparent hereinafter, one feature of the invention resides, in an analyzing method of output signals from a nozzle needle sensor, in the steps of storing a part of an nth output signal from the sensor and then analyzing a subsequent (n+m)th signal as a function of the nth signal portion. The device for carrying out the method of this invention includes threshold switches connected to the sensor and to a store for threshold values, and a control discharge unit coupled to the store for regulating its discharge.

By virtue of the cutoff of characteristic wave forms of the output signal of the nozzle needle sensor and by subsequent readjustment of the trigger levels in threshold switches in response to the amplitude, the aforementioned increased timing accuracy and reduced sensitivity to interferences is achieved. Particularly due to the readjustment of threshold levels in response to amplitude values of the signal, timing errors caused by amplitude fluctuations are eliminated.

An additional advantage of the invention is to be seen in the fact that on the basis of known characteristic wave forms of the output signal of the needle stroke detecting sensor it is possible to single out a part of the signal during the determination of the end of the injection period. In other words, the invention provides a so-called time window applied on the interpreted signal, in which the time point of the end of the injection period is anticipated to occur, the anticipation being made on the basis of the preceding known wave form. In this manner all interference pulses which are superposed to the measuring signal outside the employed time window, which accidentally might fulfill the condition for terminating the injection period are suppressed.

According to a further elaboration of this invention, the interpretation of the sensor signal is assisted by means of additional charactertic data derived from additional sensors in the engine. For example, if the fuel injection system is out of operation for a prolongated period of time, as may occur during coasting of a motor vehicle, the trigger threshold for determining the beginning of an injection period can be derived from the rotary or other characteristic parameters of the gas engine. In this manner an errorless setting of trigger levels which may occur after reactivation of the fuel injection system when the coasting mode of operation of the vehicle is terminated, are avoided.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

FIGS. 4a–g are a time plot of signals and pulse in the circuit of FIG. 3.

DESCRIPTION OF THE PREFERRED EMBODIMENTS

Figure 1:
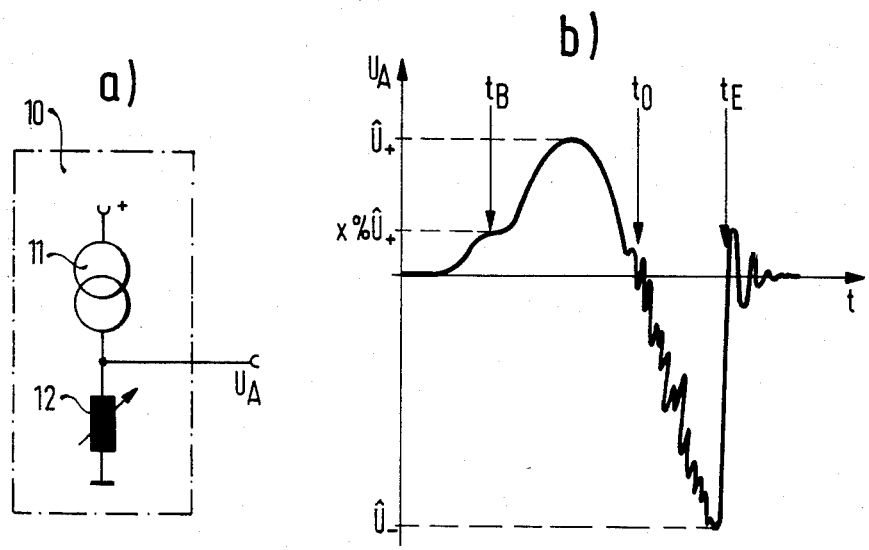
FIGS. 1a and 1b show schematically a conventional nozzle needle sensor and a time plot of a wave form of its output signal.

In FIG. 1a reference numeral 10 indicates a prior art stroke sensor of a needle of a fuel injection valve. This sensor 10 is constituted by a current source 11 and of a variable inductance 12 which varies as a function of movement of the needle. Output voltage $U_A$ generated across the inductance 12 is plotted along time t in FIG. 1b. In the opening phase of a non-illustrated fuel injection nozzle, the inductance flux variations caused by the movement of the nozzle needle generate a positive voltage p at the output terminal of the sensor 10 raising up to its peak value $\overline{U}_U{}^+$. This positive peak voltage cosresponds to the maximum velocity of the needle in the course of the opening process. In a further course of the latter process a delay in the movement of the nozzle needle will occur due to the increased force of a pressure spring acting on the needle in counter direction. As a consequence, the resulting output voltage $U_A$ drops again to lower values. During the closing phase of the fuel injection nozzle the nozzle needle moves in opposite direction and voltage generated by the inductive pickup 12 has negative value. During this return movement of the nozzle needle mechanical oscillations are produced which introduce high frequency interference signal components superposed to the actual measuring wave form. Thereafter, after reaching its negative peak value $\overline{U}_-$ the output signal $U_A$ steeply rises towards its positive values. This steep signal component is caused by the abrupt stopping of the nozzle needle at the end $t_E$ of the fuel injection period. The subsequent damped oscillations of the signal result from the resilient vibrations of the nozzle needle.

Experimental tests have shown that it is of advantage when the starting point $t_B$ of the injection period is defined as a certain percentage of the value of the positive peak voltage. The end point $t_E$ of the injection is determined by the second zero crossing of the output signal $U_A$. Furthermore, the illustrated wave form of the output signal is characterized by the fact that the negative peak value $\overline{U}_-$ always goes to higher absolute values rather than that of the positive peak voltage $\overline{U}_+$.

The method of this invention takes advantage of this particular wave form of the output signals from the nozzle needle sensor. A preferred embodiment of the circuit for carrying out this method will be explained below in connection with FIG. 2.

The output terminal of the stroke sensor 10 (FIG. 1a) is connected to a threshold switch 13, a store 14 for peaks of positive voltage as well as to a further threshold switch 15. The output of the threshold switch 13 is connected via a threshold triggered monostable mutlivibrator 16 to a flip-flop circuit 17. The output signals from the store 14 of the positive voltage peaks are fed both to an inverter 18 and a controlled store discharging unit 19. As the inventer 18 feeds inverted threshold values to the other threshold switch 15 whose output controls the flipflop 17. Another monostable multivibrator 20 controlled by input pulses which are proportional to the rotary speed of the engine, is connected at its output to the control input of the store discharge unit 19 and if desired, it is connectable to an integrator 21 (indicated by dashed lines). The output signal of the store discharging unit 19 and of the integrator 21 are applied to the threshold switch 13. The outputs of the flipflop circuit 17 produce information about the duration of the fuel injecting process. This information can be fed to a control device for regulating the injection process for example or to an indicator of the momentary fuel consumption.

Figure 3:
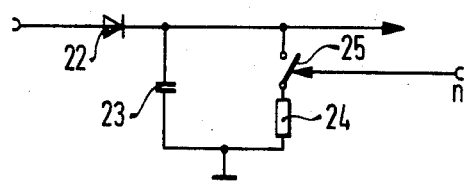
FIG. 3 is a simplified exemplary embodiment of a store for positive voltage peaks with the associated control discharging members.

FIG. 3 illustrates a simple embodiment of a store 14 of positive voltage values and of the controlled store discharging unit 19. Peak voltage store in this embodiment includes a diode 22 and a capacitor 23 connected between the ground and cathode of the diode. The anode of the diode is connected to the output of the needle stroke sensor 10. A resistor 24 is connected via switch 25 parallel to the capacitor 23. The switch 25 is controlled for example by the rotary speed signals n to interrupt the discharge of the capacitor in synchronism with the engine speed.

The operation of the subcircuit of FIG. 3 is as follows:

If capacitor 23 at a starting time point is discharged, then the diode 22 is conductive for positive input signals applied to its anode from the sensor 10 and the capacitor 23 is loaded up to a voltage corresponding to that of the input signals. If the input voltage drops to smaller positive values or to negative values, the diode 22 becomes non-conductive and provided that switch 25 is open, the load of capacitor 23 remains unchanged (assuming a no loss capacitor). A programmed control of the discharging process of the capacitor 23 is made possible by actuating the switch 25. The rate of discharge depends on the value of resistor 24 and on the closing period of the switch 25. In the present example the switch 25 is controlled by signals derived from the rotary speed of the engine. The same control, however can be derived also from other parameters of the engine, such as for example, temperature, exhaust gas values or pressure values.

Figure 2:
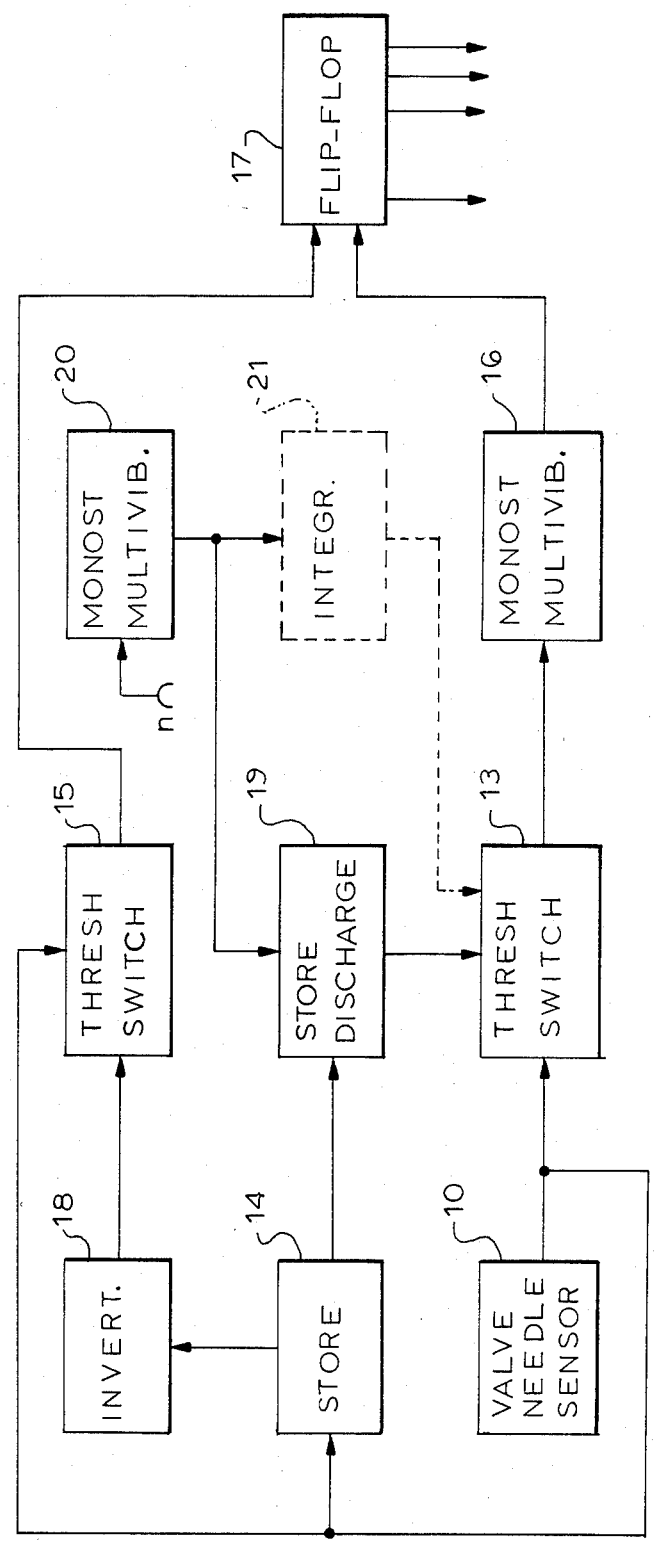
FIG. 2 is a block circuit diagram of an arrangement for analyzation of output signals from the sensor.

The function of the circuit arrangement of FIG. 2 will now be explained with reference to block diagrams a through g of FIG. 4. Subscripts of voltage U on the ordinate of respective block diagrams correspond to the designation of circuit blocks at which these signals occur. In all diagrams the time is plotted on the abscissa. The output voltage $U_{10}$ at the output of needle stroke sensor 10 as illustrated in FIG. 4a corresponds to a preset, constant rotary speed of the engine. The wave form may slightly differ from one fuel injection to another one as indicated in the exaggerated form in FIG. 4a. Changing the rotary speed, the spacing the between the wave forms as well as the amplitudes change proportionally to the speed. FIG. 4b illustrates the inverted signal $U_{18}$ at the output of inverter 18 which is used for setting the threshold value of the threshold switch 15. In order to secure proportionality between the inverted voltage $U_{18}$ and the amplitude of the positive peak values $\overline{U}_+$ there is needed a delay time constant of the positive peak values in the store 14 which is substantially larger than the possible maximum time spacing between two injection signals. The switching behavior of the threshold switch 15 is illustrated in FIG. 4c. The end of injection is characterized by a positive voltage jump of the voltage $U_{15}$. Before the threshold switch 15 can detect the injection end, namely the zero crossing following the steep raising flank of the injection signal, it must be first adjusted to a certain value. As a presumption for the detection of the zero crossing it is necessary that the signal voltage $U_{10}$ falls below the threshold level set by the voltage $U_{18}$. Only at this time point is the threshold switch 15 set to logic low and the subsequent zero crossing is indicated by the positive voltage jump from low to high. For the limiting of the time interval for detecting the injection end, in the present example is thus utilized a characteristic property of the injection signal wave form, namely the fact that the negative peak half wave $\overline{U}_-$ immediately before the end of the injection period is always larger in value than the preceding positive peak half wave $\overline{U}_+$.

By means of the monoflap or monostable multivibrator 20 the input signals proportional to the rotary speed of the engine are converted into analog rectangular pulses of a constant width as indicated in FIG. 4d by $U_{20}$. The succession of rectangular pulses $U_{20}$ is applied to the switch 25 of the controlled store discharging unit 19. The switch 25 can be a mechanical or purely electronic switching device. The resulting voltage $U_{19}$ at the output of the discharger 19 is illustrated in FIG. 4e. In the time interval between two injection signals, the capacitor 23 is discharged in synchronism with the speed proportional pulses $U_{20}$. The end voltage value designated by x percent $\overline{U}_+$ is determined by a suitable dimensioning of the capacitor 23 or of the resistor 24 and by the pulse width of the speed proportional pulses $U_{20}$. Provided that the latter values are held constant, a variation of the absolute value of the x percent $\overline{U}_+$ depends exclusively on the change of the amplitude of the injection signal $U_{10}$. In this manner it is insured at a change of the signal amplitude $U_{10}$ of the injection signal that a corresponding change of the threshold x percent $\overline{U}_+$ for determining the injection beginning is carried out in the same sense. In the present example, the threshold for the (n+1)th injection signal is derived from the nth signal. However, other situations are also possible in which each with injection signal is not employed for determining the threshold value or in which the nth injection signal is used for the threshold level determination of the (n+m)th signal.

When the injection signal voltage $U_{10}$ of the (n+1)th signal is equal to the threshold level derived from the nth signal, then the threshold switch 13 activates the monoflop or monostable multivibrator 16 to produce a succession of pulses of a constant length as indicated in FIG. 4f. The length $T_M$ of these pulses is selected such as to exceed under all circumstances the entire length of the injection signal.

Hence, for determining the beginning of the injection the fact is utilized that the wave form as well the amplitude of consecutive injection signals differ only unsubstantially from each other.

The injection duration signals illustrated in FIG. 4g appear at the output of the flipflop 17, the latter being controlled by signals $U_{15}$ and and $U_{16}$. These injection duration signals $U_{17}$ are applied to a non-illustrated injection control or regulating device or to other components of the engine.

There is also a possibility to control the threshold level of threshold switch 13 by other parameters of the gas engine, such as rotary speed or pressure values. If the engine of a motor vehicle is provided with switching means for disconnecting the fuel distribution during the coasting mode of operation of the engine, then during the coasting operation the fuel injection valves remain closed and the injection signals $U_{10}$ disappear. As a result, the threshold voltage levels $U_{19}$ drop to very low values or to zero and consequently when the fuel injection system is switched on after the end of the coasting operation, the threshold level $U_{19}$ is not adjusted to the proper operation of the injection valve inasmuch as the value of threshold $U_{19}$ may have the value of the actual amplitude of the injection signal $U_{10}$ which at the end of the coasting operation of a motor vehicle may be very high (high rotary speeds). In this situation, it has proved advantageous to derive the threshold value for determining the starting point of the injection from the rotary speed after the injection valve has resumed its operation. For this purpose there is provided an integrator 21 (FIG. 2) which integrates for example the output pulses from the monostable multivibrator 20 so that the output voltage has a time behavior depending on the rotary speed. Instead of rotary speed signals it is also possible to use for readjusting the threshold voltage level and other parameters characterizing operational state of the engine.

It will be understood that each of the elements described above, or two or more together, may also find a useful application in other types of constructions differing from the types described above.

For example, above described method and circuit arrangement for carrying out the method can be applied with advantage also for precise interpretation of other measuring magnitudes occurring in a time sequence such as for example rotary speed signals, ignition time point signals, or signals for regulating the overall operation of the engine and the like. The prerequisite condition for utilizing this novel method is the knowledge of characteristic wave forms of these other signals.

If this condition is fulfilled then by singling out certain regions of the wave form an increased resistance against interference is achievable. Similarly, by virtue of the abovedescribed threshold level readjustment depending on the amplitude of the measuring signal which normally is subject to insignificant amplitude changes only, an increased measuring accuracy is obtained.

While the invention has been illustrated and described as embodied in a specific example of an interpretation circuit for the injection signals, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of evaluating output signals from a sensor installed in an internal combustion engine to pick up data characteristic of operational conditions of the engine, the sensor generating a chronological sequence of n electrical output signals the waveforms of which depend on a measured parameter of the engine and which contain information about additional parameters which are not unconditionally identical with the parameters under test, comprising the step of using a fractional part of a value of an nth output signal for the evaluation of a subsequent (n+m)th signal from said sensor.

2. A circuit arrangement for evaluating an output signal from a sensor installed in an internal combustion engine to pick up data characteristics of operational conditions of the engine comprising threshold switches connected to said data sensor, means for adjusting the threshold values of at least one of said switches, said adjusting means including at least one storage device connected to said data sensor, and means for coupling one of said threshold switches to said storage device.

3. A circuit for evaluating an output signal from a sensor installed in an internal combustion engine to pick up data characteristics of operational conditions of the engine, comprising threshold switches connected to said data sensor, means for adjusting the threshold values of said switches, said adjusting means including a storage device connected to said data sensor, controlled discharging means connected to said storage device and means for coupling one of said threshold switches to said storage device, said coupling means including an inverter, and the circuit further comprising a source of pulses which are dependent on the rotary speed of the engine, said source being connected to said discharging means for controlling the discharge of said storage device.

4. A circuit arrangement for evaluating an output signal from a sensor installed in an internal combustion engine to pick up data characteristics of operational conditions of the engine, comprising threshold switches connected to said data sensor, means for adjusting the threshold values of said switches, said adjusting means including a storage device connected to said data sensor, controlled discharging means connected to said storage device and means for coupling one of said threshold switches to said storage device, said sensor being connected to a first threshold switch, to a peak voltage store and to a second threshold switch, said peak voltage store being connected via an inverter to the second threshold switch, said circuit arrangement further comprising a first and a second monostable multivibrator, a flipflop circuit having two inputs and a plurality of outputs, said first monostable multivibrator being connected at its input to said first threshold switch and at its output to one of the inputs of said flipflop, said second monostable multivibrator having an input controlled by pulses derived from the rotary speed of the engine and having its output connected to said means for controlling the discharge of said peak voltage store, and the output of the second threshold switch being connected to the other input of said flipflop, whereby the signals at said outputs of the flipflop are indicative of the operational condition of the engine.

5. A method as defined in claim 1, further comprising the step of using additional characteristic data of the engine for evaluating the output signals from said sensor.

6. A method as defined in claim 1, wherein a fraction of the peak value of the nth output signal from said sensor is used as a triggering threshold for the subsequent (n+m)th output signal.

7. A method as defined in claim 6, wherein said internal combustion engine is a diesel engine having a fuel injection valve and said sensor is coupled to the needle of the injection valve to provide a signal proportional to the stroke or to the velocity of the needle.

8. A method as defined in claim 7, wherein the output signal from said needle stroke sensor is used for retrieving information about duration of an injection process and thus about the amount of fuel supplied to the engine.

9. A method as defined in claim 8, wherein the detection of the end of the injection period which is defined by a zero crossing of the output signal from the needle stroke sensor, is carried out only after the passage of the signal through a threshold derived from the peak value of the signal.

10. A method as defined in claim 6, wherein in case of an interruption of fuel injection such as for instance during the coasting operation of a motor vehicle, the threshold value is derived from additional parameters of the engine such as rotary speed.

11. A method as defined in claim 8 wherein a control signal which is derived from the injection period and is dependent on the load of the engine is applied to a control device for regulating the amount of fuel applied to the engine.

12. A circuit arrangement as defined in claim 2 wherein said coupling means includes an inverter.

13. A circuit arrangement as defined in claim 3 further comprising means for adjusting the threshold value for at least one of said threshold switches in response to an additional operational parameter of said engine, sensed in addition to the parameter picked up by said sensor.

14. A circuit arrangement as defined in claim 4, further comprising an integrator connected between the output of said second monostable multivibrator and an input of said first threshold switch to adjust the threshold level of said first threshold switch according to additional parameters of the internal combustion engine.

15. A circuit arrangement as defined in claim 2 wherein said coupling means includes a discharging member.

16. A method as defined in claim 11 wherein said control signal is applied to a device for regulating the recirculation of exhaust gas.

17. A method as defined in claim 11 wherein said control signal is applied to a device for regulating idling speed of the engine.

18. A method as defined in claim 11 wherein said control signal is applied to a device for indicating the momentary consumption of fuel.

* * * * *